(12) United States Patent
Shirota et al.

(10) Patent No.: US 11,978,515 B2
(45) Date of Patent: May 7, 2024

(54) SEMICONDUCTOR MEMORY DEVICE AND READING METHOD

(71) Applicant: Winbond Electronics Corp., Taichung (TW)

(72) Inventors: Riichiro Shirota, Kanagawa (JP); Masaru Yano, Kanagawa (JP)

(73) Assignee: Winbond Electronics Corp., Taiching (TW)

( * ) Notice: Subject to any disclaimer, the term of this patent is extended or adjusted under 35 U.S.C. 154(b) by 69 days.

(21) Appl. No.: 17/179,409

(22) Filed: Feb. 19, 2021

(65) Prior Publication Data

US 2021/0272634 A1 Sep. 2, 2021

(30) Foreign Application Priority Data

Mar. 2, 2020 (JP) ................. 2020-034586

(51) Int. Cl.
*G11C 5/06* (2006.01)
*G11C 16/04* (2006.01)
*G11C 16/08* (2006.01)
*G11C 16/10* (2006.01)
*G11C 16/26* (2006.01)

(52) U.S. Cl.
CPC .......... *G11C 16/26* (2013.01); *G11C 16/0483* (2013.01); *G11C 16/08* (2013.01); *G11C 16/10* (2013.01)

(58) Field of Classification Search
CPC .................................. G11C 16/0483
See application file for complete search history.

(56) References Cited

U.S. PATENT DOCUMENTS

| 5,673,223 | A | 9/1997 | Park |
| 7,196,928 | B2 | 3/2007 | Chen |
| 10,438,674 | B2 | 10/2019 | Seo |
| 2007/0147141 | A1* | 6/2007 | Shibata .............. G11C 16/3459 365/189.09 |

(Continued)

FOREIGN PATENT DOCUMENTS

| CN | 103137200 | 6/2013 |
| JP | H097383 | 1/1997 |

(Continued)

OTHER PUBLICATIONS

"Office Action of Taiwan Counterpart Application", dated May 20, 2021, p. 1-p. 7.

(Continued)

*Primary Examiner* — Jason Lappas
(74) *Attorney, Agent, or Firm* — JCIPRNET

(57) ABSTRACT

A semiconductor memory device capable of reducing failure caused by a source side effect after a large number of W/E cycles is provided. A reading method of a NAND flash memory includes: dividing multiple word lines connected to each memory cell of a NAND string into a group 1 of word lines WL0 to WLi−1, a group 2 of word lines WLi to WLj, . . . , a group y of word lines WLj+1 to WLk−1, and a group x of word lines WLk to WLn, presetting a relationship that each readout voltage (Vread1, Vread2, . . . , Vready, and Vreadx) corresponding to each group increases toward a bit line side, and applying a readout voltage to a selected word line according to the relationship.

13 Claims, 5 Drawing Sheets

(56) References Cited

U.S. PATENT DOCUMENTS

| | | | |
|---|---|---|---|
| 2009/0323412 A1 | 12/2009 | Mokhlesi et al. | |
| 2011/0069557 A1 | 3/2011 | Namiki et al. | |
| 2013/0242667 A1 | 9/2013 | Shim et al. | |
| 2016/0019971 A1* | 1/2016 | Horii | G11C 11/5642 365/185.17 |
| 2019/0096495 A1* | 3/2019 | Shim | G11C 5/06 |

FOREIGN PATENT DOCUMENTS

| | | |
|---|---|---|
| JP | 2011086364 | 4/2011 |
| JP | 2011527067 | 10/2011 |
| JP | 5952366 | 7/2016 |
| JP | 5992983 | 9/2016 |
| KR | 20120005834 | 1/2012 |
| KR | 101199071 | 11/2012 |
| KR | 20140060809 | 5/2014 |
| KR | 101564399 | 10/2015 |
| KR | 20180023530 | 3/2018 |
| TW | I309830 | 5/2009 |

OTHER PUBLICATIONS

"Office Action of Japan Counterpart Application", dated Apr. 7, 2021, p. 1-p. 6.

"Office Action of Korea Counterpart Application", with English translation thereof, dated Apr. 29, 2022, p. 1-p. 10.

"Office Action of Korea Counterpart Application", with English translation thereof, dated Feb. 13, 2023, p. 1-p. 9.

"Office Action of Korea Counterpart Application", dated Aug. 28, 2023, pp. 1-5.

\* cited by examiner

| WL0 | ··· | WLi-1 | WLi | ··· | WLj | ··· | WLj+1 | ··· | WLk-1 | WLk | ··· | WLn |
|---|---|---|---|---|---|---|---|---|---|---|---|---|
| Group 1 ||| Group 2 ||| | Group y |||| Group x |||
| $V_{read1}$ ||| $V_{read2}$ ||| | $V_{ready}$ |||| $V_{readx}$ |||

Voltage setting: $V_{read1} < V_{read2} < \cdots < V_{ready} < V_{readx}$

FIG. 6

| WL0 | ··· | WLi-1 | WLi | ··· | WLj | ··· | WLj+1 | ··· | WLk-1 | WLk | ··· | WLn |
|---|---|---|---|---|---|---|---|---|---|---|---|---|
| Group 1 ||| Group 2 ||| | Group y |||| Group x |||
| $V_{passr1}$ ||| $V_{passr2}$ ||| | $V_{passry}$ |||| $V_{passrx}$ |||

Voltage setting: $V_{passr1} < V_{passr2} < \cdots < V_{passry} < V_{passrx}$

FIG. 7

SEMICONDUCTOR MEMORY DEVICE AND READING METHOD

CROSS-REFERENCE TO RELATED APPLICATION

This application claims the priority benefit of Japan application serial no. 2020-034586, filed on Mar. 2, 2020. The entirety of the above-mentioned patent application is hereby incorporated by reference herein and made a part of this specification.

BACKGROUND

Technical Field

The disclosure relates to a semiconductor memory device such as a Not AND (NAND) flash memory, and more particularly to a reading method thereof.

Description of Related Art

The NAND flash memory performs readout or programming in units of pages and performs erasing in units of blocks. Regarding such NAND flash memory, for example, Japanese Patent No. 5952366 discloses an erasing method, which can suppress deterioration of a gate oxide film caused by repeated data rewriting and increase the number of data rewrites; and Japanese Patent No. 5992983 discloses a programming method, which can implement narrowing of a threshold distribution range.

SUMMARY

In a NAND flash memory, as shown in FIG. 1, a NAND string has multiple memory cells connected in series, a bit line side selection transistor connected to a bit line BL, and a source line side selection transistor connected to a source line SL. Each of the memory cells is connected to a corresponding word line WLi (where i=0, 1, 2, ..., n). Here, for convenience of description, the memory cell connected to the word line WLi is referred to as a memory cell i. In addition, the NAND string may also include a dummy memory cell (not shown in FIG. 1) adjacent to the bit line side selection transistor or the source line side selection transistor.

A threshold Vt of a memory cell storing data "0" is a greater than the threshold Vt of a memory cell storing data "1" and is a positive value. FIG. 2 shows an example of a bias voltage applied to each word line when reading data of a memory cell n connected to a selected word line WLn during a readout operation. The word line selected for reading the memory cell n is the selected word line, and other word lines are non-selected word lines. As shown in FIG. 2, a readout voltage Vread is applied to the selected word line WLn, readout pass voltages Vpassr are applied to other non-selected word lines, a certain positive voltage for turning on a transistor is applied to gates SGD of the bit line side selection transistor and the source line side selection transistor, and a positive bias voltage greater than a bias voltage applied to the source line SL is applied to the bit line BL. Here, the readout pass voltage Vpassr is used to turn on the non-selected memory cell, so the readout voltage Vpassr is greater than the threshold Vt of the data "0".

In general, the greater the magnitude of the bias voltage minus the threshold Vt of the word line WL, the smaller the channel resistance of each memory cell. Since the threshold Vt of the memory cell of the data "0" is greater than the threshold Vt of the memory cell of the data "1", the channel resistance of the memory cell of the data "0" is greater than the channel resistance of the memory cell of the data "1".

The threshold Vt of the read memory cell is defined according to the magnitude of the readout voltage Vread. The memory cell of the data "0" has the threshold Vt greater than a certain preset value, and the memory cell of the data "1" has the threshold Vt less than or the same as the preset value.

The NAND flash memory has a back pattern effect, which enables the threshold Vt of the read memory cell to have a strong dependence on the data of other memory cells of the NAND string. For example, compared with the case where all other memory cells have the data "1", when all other memory cells have the data "0", the threshold Vt of the read memory cell is greater. That is, the overall channel resistance when all other memory cells have the data "0" is greater than the overall channel resistance when all other memory cells have the data "1". Therefore, the current flowing through the NAND string when all other memory cells have the data "0" is less than the current flowing through the NAND string when all other memory cells have the data "1". As a result, the threshold Vt of the memory cell read in a page buffer/readout circuit appears to be greater.

In addition, when reading the memory cell i, due to the body effect of the metal oxide semiconductor field effect transistor of the memory cell i, compared to the data stored between the memory cell i+1 and the memory cell n, the data stored between the memory cell 0 and the memory cell i−1 has a greater influence on the threshold Vt of the memory cell i, which is referred to as the "source side effect". Specifically, even when the data of all memory cells in the NAND string are the same, the source side effect will still shift the threshold Vt of the memory cell near the bit line BL to be greater than the threshold Vt of the memory cell near the source line.

The influence of the back pattern effect on the threshold is explained with reference to FIG. 3. In FIG. 3, (A) and (B) show NAND strings with different data patterns between the memory cell 0 and the memory cell n−1. When the memory cell n of the data "1" is read, due to the back pattern effect, the resistance of the memory cells on the source side from the memory cell 0 to the memory cell n−1 of (A) in FIG. 3 becomes greater than the resistance of that of (B) in FIG. 3. Therefore, the threshold value Vt of the memory cell n of (A) in FIG. 3 becomes greater than the threshold value Vt of the memory cell n of (B) in FIG. 3.

In general, the channel resistance of a memory cell increases as the number of write and erase cycles (hereinafter referred to as W/E cycles) increases. Therefore, the overall resistance of a NAND string after a large number of W/E cycles will be greater than that of a NAND string after less W/E cycles. For example, after the NAND string of (A) in FIG. 3 undergoes a large number of W/E cycles, the threshold Vt of the memory cell n increases as the W/E cycles increase, so that a readout error (the data "1" of the memory cell on the bit line side shifts to the data "0") occurs due to the source side effect when the data of the memory cell n is read.

The disclosure solves such conventional issues, and the objective of the disclosure is to provide a semiconductor memory device and a reading method capable of reducing failure caused by a source side effect after a large number of W/E cycles.

In the reading method of the NAND flash memory of the disclosure, when the readout voltage is applied to the selected word line, the readout voltage is set to increase toward the bit line side. In an embodiment, multiple word lines connected to each memory cell of the NAND string are divided into at least three groups, the relationship that each readout voltage corresponding to each group increases toward the bit line side is preset, and the readout voltage is determined based on the relationship.

The semiconductor memory device of the disclosure includes a NAND memory cell array formed with a NAND string; a readout component reading a page of the memory cell array; and a setting component dividing multiple word lines connected to each memory cell of the NAND string into at least three groups and setting the relationship that each readout voltage corresponding to each group increases toward the bit line side, so that the readout component applies a readout voltage to a selected word line based on the relationship set by the setting component.

In the disclosure, the readout voltage applied to the selected word line increases toward the bit line side, or the readout pass voltage applied to the non-selected word line increases toward the bit line side, thereby reducing the readout error caused by the source side effect.

In addition, in the disclosure, the readout pass voltage applied to the non-selected word line may also be dynamically set according to the position of the selected word line. Specifically, the readout pass voltage applied to the non-selected word line between the selected word line and the source line may be greater than the readout pass voltage applied to the non-selected word line between the selected word line and the bit line to reduce the readout error caused by the source side effect.

BRIEF DESCRIPTION OF THE DRAWINGS

FIG. 6 is a table of a relationship between groups of divided word lines and readout voltages according to a first embodiment of the disclosure.

FIG. 7 is a table of a relationship between groups of divided word lines and readout pass voltages according to a second embodiment of the disclosure.

DETAILED DESCRIPTION OF DISCLOSED EMBODIMENTS

A semiconductor memory device of the disclosure is implemented in a NAND flash memory or a micro controller, a micro processor, a logic, etc. embedded with the flash memory.

Figure 1:
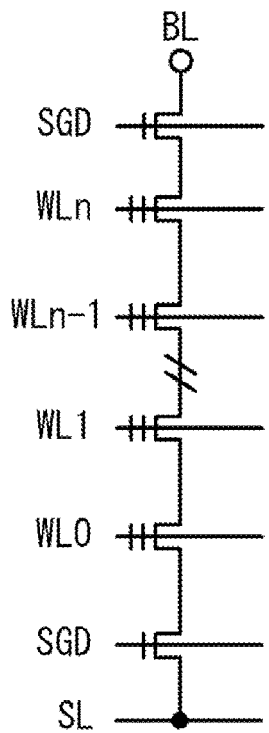
FIG. 1 is a diagram of a structure of a NAND string of a NAND flash memory.
Figure 2:
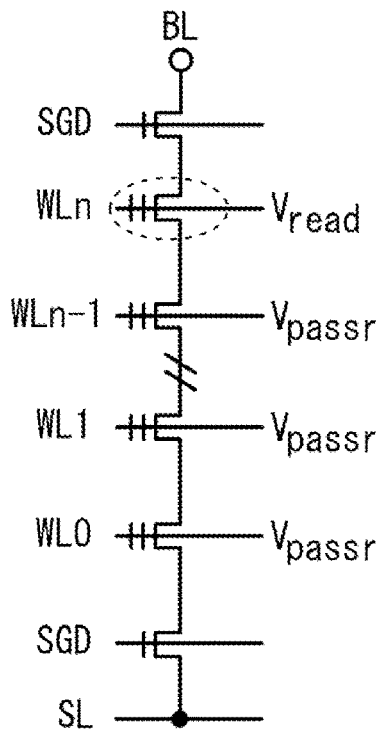
FIG. 2 is a diagram of a bias voltage applied to the NAND string during a readout operation.
Figure 3:
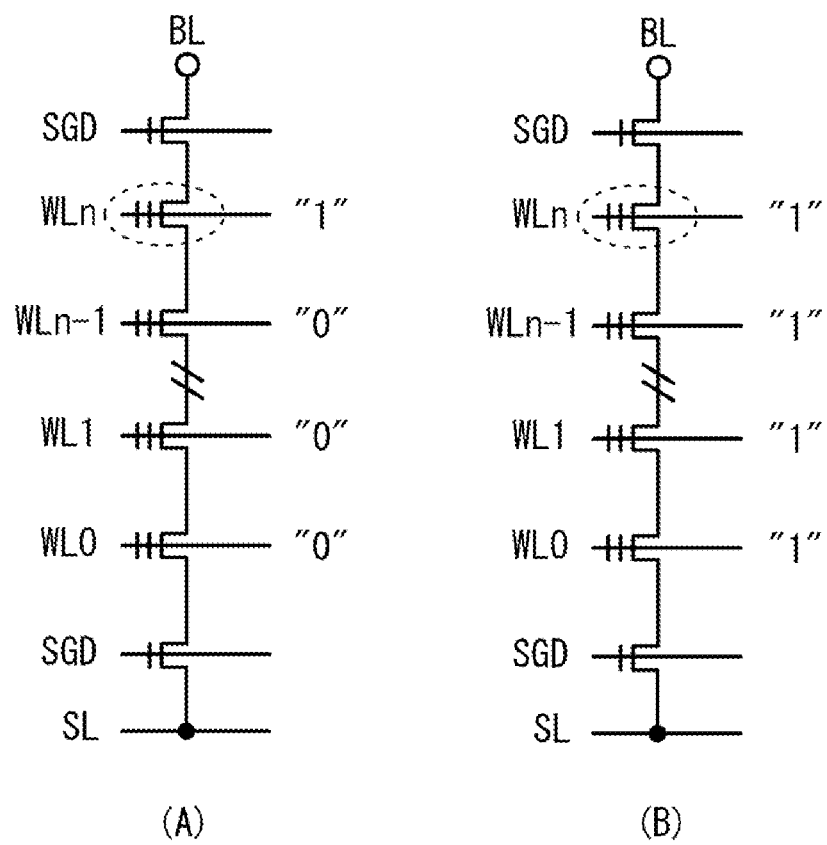
In FIG. 3, (A) is a diagram of a NAND string of a memory cell 0 to a memory cell n−1 with data "0" and (B) is a diagram of a NAND string of the memory cell 0 to the memory cell n−1 with data "1".
Figure 4:
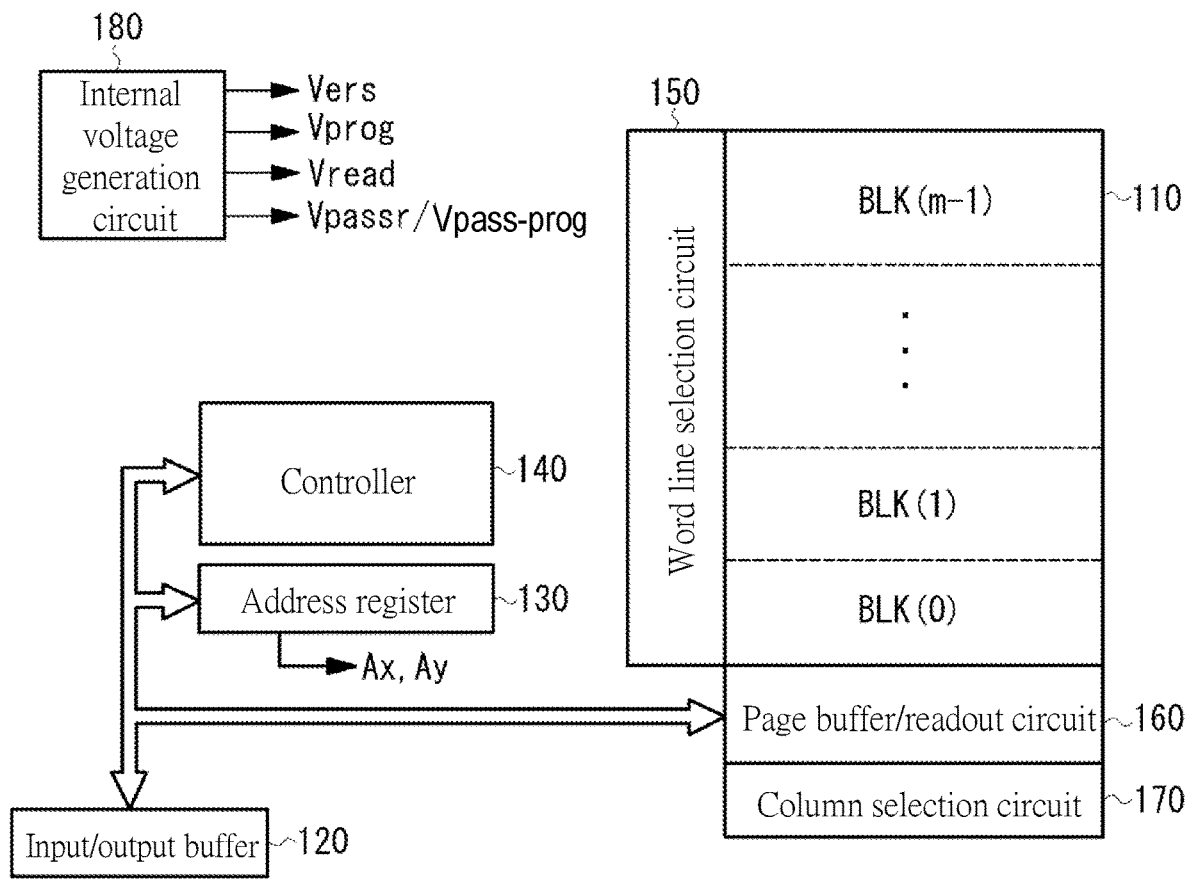
FIG. 4 is a diagram of an internal structure of the NAND flash memory according to an embodiment of the disclosure.

Next, the internal structure of the NAND flash memory of the embodiment of the disclosure is shown in FIG. 4. A flash memory 100 includes a memory cell array 110 formed by multiple memory cells arranged in a matrix; an input/output buffer 120 connected to an external input/output terminal I/O; an address register 130 receiving address data from the input/output buffer 120; a controller 140 receiving command data, etc. from the input/output buffer 120 and controlling each part; a word line selection circuit 150 receiving row address information Ax from the address register 130, decoding the row address information Ax, and performing block selection, word line selection, etc. based on a decoding result; a page buffer/readout circuit 160 keeping data read from the page selected by the word line selection circuit 150 or keeping input data that should be programmed to the selected page; a column selection circuit 170 receiving column address information Ay from the address register 130, decoding the column address information Ay, and selecting column address data in the page buffer/readout circuit 160 based on the decoding result; and an internal voltage generation circuit 180 generating various voltages (a programming voltage Vprog, a pass voltage Vpass-prog, a readout pass voltage Vpassr, a readout voltage Vread, an erase voltage Vers, etc.) required for data readout, programming, erasing, etc.

The memory cell array 110 includes multiple blocks BLK(0) to BLK(m−1). Multiple NAND strings are formed in each block. The NAND string may be two-dimensionally formed on a substrate, or three-dimensionally formed along the vertical direction from the main surface of the substrate. Moreover, a memory cell may store binary data or multi-value data.

The controller 140 may be constructed using hardware and/or software, and may include, for example, a microcomputer, a state machine, a logic, etc. The controller 140 controls readout, write (programming), erase, etc. operations based on an externally input command and/or control signal (an address latch enable signal or a command latch enable signal).

During the readout operation, the readout voltage Vread is applied to a selected word line, the readout pass voltage Vpassr is applied to a non-selected word line, and a positive voltage is applied to a selected gate line SGD, so that a bit line side selection transistor and a source line side selection transistor are turned on. A certain positive voltage is applied to a bit line, and, for example, 0 V is applied to a shared source line. During the write (programming) operation, a high-voltage programming voltage Vprog is applied to the selected word line, and a middle pass voltage Vpass-prog is applied to the non-selected word line, so that the bit line side selection transistor is turned on and the source line side selection transistor is turned off. Potential corresponding to the data "0" or "1" is supplied to the bit line. During the erase operation, a certain voltage is applied to the selected word line in the block, a high-voltage erase pulse is applied to a p-well, and electrons of a floating gate are extracted to the substrate, so as to erase in units of blocks.

Figure 5:
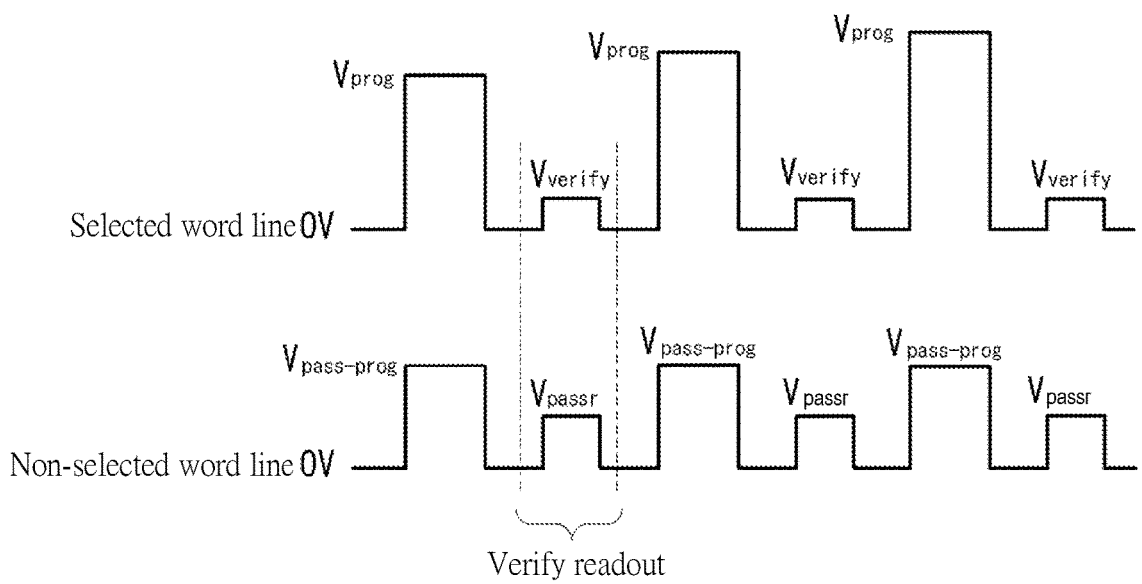
FIG. 5 is a diagram of a write operation and a write verification of the NAND flash memory according to an embodiment of the disclosure.

Next, the operation of the NAND flash memory of the embodiment will be described. Before describing the novel reading method of the embodiment, the premise of the reading method will be described. There are two types of readout operations, one is readout implemented according to a readout command, and the other one is verify readout during the write operation according to a programming command. FIG. 5 shows a bias voltage applied to the selected word line and the non-selected word line during the write operation. For the selected word line, a high-voltage pulse (the programming voltage Vprog) is applied during writing, and a verify readout voltage Vverify is applied during the verify readout after the pulse is applied. For the non-selected word line, a middle-voltage pulse (the pass voltage Vpass-prog) for programming is applied during writing, and the readout pass voltage Vpassr is applied during the verify readout after the pulse is applied.

Programming each memory cell connected to the selected word line at the same time is referred to as page programming. The verify readout is to detect the threshold Vt of each programmed memory cell. When it is detected that the threshold Vt of the memory cell programmed as the data "0" is greater than the verify readout voltage Vverify, the verify readout passes and the programming of the memory cell stops. On the other hand, when it is detected that the threshold Vt of the memory cell programmed as the data "0" is less than the verify readout voltage Vverify, the next high-voltage pulse (the programming voltage Vprog) greater by ΔV is applied to further program the memory cell. Finally, when the threshold Vt of the memory cell becomes greater than the verify readout voltage Vverify, the programming operation ends. By using a programming verify sequence, the distribution of the threshold Vt of the memory cells programmed with the data "0" can be narrowed. Moreover, in order to obtain a voltage margin between the verify readout voltage Vverify and the readout voltage Vread, the verify readout voltage Vverify is less than the readout voltage Vread.

In a first embodiment of the disclosure, during the readout operation, the readout voltage Vread applied to the selected word line is changed according to the numbering or position of the selected word line. On the other hand, the readout voltage Vverify is set to a fixed magnitude regardless of the selected word line during programming.

The table shown in FIG. 6 shows the relationship between each group when the selected word line is divided into multiple groups and the readout voltage Vread applied to the selected word line. In the embodiment, word lines WLi (where i=0, 1, 2, ..., n) sequentially have numberings 0, 1, 2, ..., n starting from the source line side. During the readout operation, all word lines WL are divided into several groups greater than 2. For example, the foremost first group 1 includes a word line WL0 to a word line WLi−1, a group 2 includes a word line WLi to a word line WLj, ..., and the last group x includes a word line WLk to a word line WLn. Here, i is greater than 2, j is greater than i, and k is greater than j.

Please refer to FIG. 6. In the embodiment, the magnitude of the readout voltage Vread applied to the selected word line is set to increase in stages as the group where the selected word line is located shifts toward the bit line side. That is, when the selected word line is located in the group 1, a readout voltage Vread1 is applied to the selected word line, and when the selected word line is located in the group 2, a readout voltage Vread2 is applied to the selected word line, ..., when the selected word line is located in the group y, a readout voltage Vready is applied to the selected word line, and when the selected word line is located in the group x, a readout voltage Vreadx is applied to the selected word line, where the readout voltage Vread1<Vread2< . . . <Vready<Vreadx. The setting of the relationship between the readout voltage Vread and the word line group shown in the table may, for example, be stored in a fuse cell that stores setting information related to the operation of the flash memory. The setting information stored in the fuse cell is, for example, loaded into a register when the power of the flash memory is connected. During the readout operation, the controller 140 determines the magnitude of the readout voltage Vread according to the setting information in the register.

Since the threshold Vt of the memory cell of the data "1" near the bit line BL after a large number of W/E cycles tends to become greater than before the W/E cycles, the memory cell of the data "1" may be easily misread as the data "0". At this time, by the reading method of the embodiment, increasing the readout voltage Vread near the bit line BL can effectively offset the increase in the threshold Vt of the memory cell near the bit line, so as to reduce the number of readout errors.

It is worth mentioning that if the increase of the readout voltage Vread near the bit line BL is excessive, a threshold margin of the memory cell read between the verify readout voltage Vverify and the readout voltage Vread will decrease. Therefore, in an embodiment, there is an optimal value for the increase of the readout voltage Vread of the word line on the bit line side. For example, the difference between the readout voltage Vreadx of the word line WLn and the readout voltage Vread1 of the word line WL0 is Vreadx−Vread1=0.2 V to 0.4 V.

During the readout operation, a readout command and address information are imported into the inside via the input/output buffer 120. The controller 140 determines the magnitude of the readout voltage Vread applied to the selected word line based on a row address according to the setting shown in FIG. 6. Specifically, the internal voltage generation circuit 180 generates the readout voltage Vread set in the table of FIG. 6. The word line selection circuit 150 turns on a transistor connected to the selected word line based on the row address, and the readout voltage Vread generated by the internal voltage generation circuit 180 is applied to the selected word line via the transistor.

Next, a second embodiment of the disclosure will be described. In the second embodiment, during the readout operation, the readout pass voltage Vpassr applied to the non-selected word line is changed according to the position or numbering of the selected word line.

The table shown in FIG. 7 shows the relationship between each group when the selected word line is divided into multiple groups and the readout pass voltage Vpassr applied to the non-selected word line. In the second embodiment, the word lines WLi (i=0, 1, 2, ..., n) sequentially have numberings 0, 1, 2, ..., n starting from the source line side. During the readout operation, all word lines WL are divided into several groups greater than 1. For example, the foremost first group 1 includes the word line WL0 to the word line WLi−1, the group 2 includes the word line WLi to the word line WLj, ..., and the last group x includes the word line WLk to the word line WLn. Here, i is greater than 2, j is greater than i, and k is greater than j.

Please refer to FIG. 7, in the embodiment, the magnitude of the readout pass voltage Vpassr applied to the non-selected word line is set to increase in stages as the group where the selected word line is located shifts toward the bit line side. That is, when the selected word line is located in the group 1, a readout pass voltage Vpassr1 is applied to the non-selected word line, when the selected word line is located in the group 2, a readout pass voltage Vpassr2 is applied to the non-selected word line, ..., when the selected word line is located in the group y, a readout pass voltage Vpassry is applied to the non-selected word line, and when the selected word line is located in the group x, a readout pass voltage Vpassrx is applied to the non-selected word line, where the readout pass voltage Vpassr1<Vpassr2< . . . <Vpassry<Vpassrx.

In the embodiment, the setting of the readout pass voltage Vpassr is used during the readout operation and may also be used during the verify readout of the programming operation. That is, as shown in FIG. 5, during the verify readout of the write operation, the readout pass voltage Vpassr applied to the non-selected word line is changed according to the position of the selected word line. Compared with the previous setting that uses a lower and fixed readout pass voltage, by using the setting of the readout pass voltage of the embodiment, when the memory cell near the bit line is read, the overall resistance of the NAND string will decrease, thereby offsetting the increase in resistance of the NAND string after a large number of W/E cycles, so as to reduce the number of readout errors (misreading the data "1" as the data "0").

The setting of the table shown in FIG. 7 is the same as in the first embodiment, and may, for example, be stored in the fuse cell as the setting information related to the operation of the flash memory. The setting information stored in the fuse cell is, for example, loaded into the register when the power of the flash memory is connected. During the readout operation, the controller 140 determines the magnitude of the readout pass voltage Vpassr according to the setting information in the register.

During the readout operation, the readout command and the address information are imported into the inside via the input/output buffer 120. The controller 140 applies the readout voltage Vread to the selected word line based on the row address, and determines the magnitude of the readout pass voltage Vpassr applied to the non-selected word line according to the setting shown in FIG. 7. Specifically, the internal voltage generation circuit 180 generates the readout pass voltage Vpassr set in the table of FIG. 7, applies the readout voltage Vread to the selected word line selected by the word line selection circuit 150, and applies the readout pass voltage Vpassr to the non-selected word line. In addition, the same applies to the verify readout during the write operation. When the controller 140 performs the verify readout on the selected word line selected for writing, the readout pass voltage Vpassr is applied to the non-selected word line according to the setting shown in FIG. 7.

Next, a third embodiment of the disclosure will be described. In the third embodiment, during the readout operation, the readout pass voltage Vpassr applied to the non-selected word line is changed according to the position or numbering of the selected word line. Here, unlike the second embodiment whereby the readout pass voltage applied to all non-selected word lines is a single value, in the third embodiment, the readout pass voltage applied to the non-selected word line between the selected word line and the bit line, and the readout pass voltage applied to the non-selected word line between the selected word line and the source line have different values.

Figure 8:
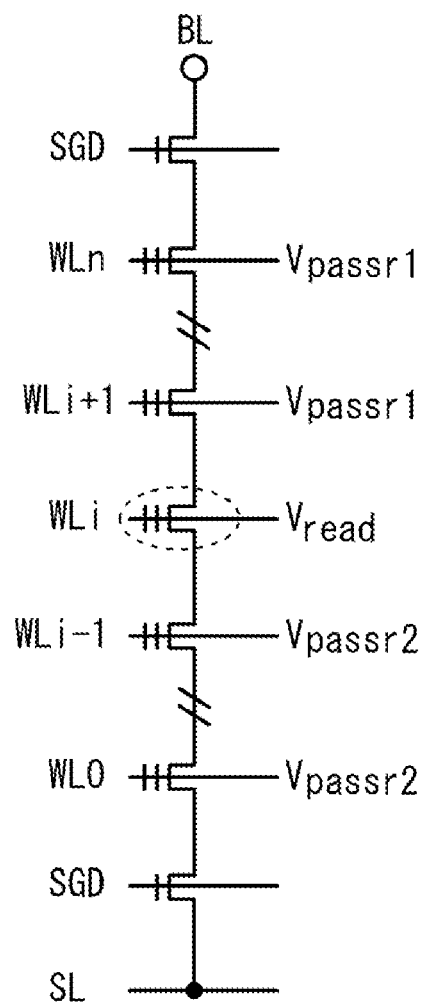
FIG. 8 is a diagram of an application example of readout pass voltages according to a third embodiment of the disclosure.

FIG. 8 shows the readout pass voltage Vpassr1 and the readout pass voltage Vpassr2 applied to the non-selected word lines when reading the memory cell i connected to the selected word line WLi of the NAND string. As shown in the drawing, in the embodiment, during the readout operation, the non-selected word lines are divided into two groups. The first group are the non-selected word lines between the selected word line WLi and the bit line BL, which includes the word line WLi+1 to the word line WLn. The readout pass voltage applied to the non-selected word lines in the first group is Vpassr1. The second group are the non-selected word lines between the selected word line WLi and the source line SL, which includes the word line WL0 to the word line WLi−1. The readout pass voltage applied to the non-selected word lines in the second group is Vpassr2.

In the embodiment, the readout pass voltage Vpassr2 is set to be greater than the readout pass voltage Vpassr1 (Vpassr2>Vpassr1). Therefore, when reading the memory cell connected to the word line near the bit line BL, the readout pass voltage applied to most non-selected word lines will be set as the readout pass voltage Vpassr2. Compared with the previous setting that uses a lower and fixed readout pass voltage, by using the setting of the readout pass voltage Vpassr of the embodiment, when reading the memory cell near the bit line BL, the overall resistance of the NAND string will decrease, thereby offsetting the increase in resistance of the NAND string after a large number of W/E cycles, so as to reduce the number of readout errors (misreading the data "1" as the data "0"). Similar to the second embodiment, the setting of the readout pass voltage Vpassr in the embodiment is also used during the readout operation and may also be used during the verify readout of the programming operation.

In addition, the setting of the magnitudes of the readout pass voltage Vpassr1 and the readout pass voltage Vpassr2 is the same as in the first embodiment and may, for example, be stored in the fuse cell as the setting information related to the operation of the flash memory. The setting information stored in the fuse cell is, for example, loaded into the register when the power of the flash memory is connected. During the readout operation, the controller 140 determines the magnitudes of the readout pass voltage Vpassr1 and the readout pass voltage Vpassr2 according to the setting information kept in the register.

During the readout operation, the readout command and the address information are imported into the inside via the input/output buffer 120. The controller 140 applies the readout voltage Vread to the selected word line selected for reading based on the row address, and applies the readout pass voltage Vpassr1 to the non-selected word line between the selected word line and the bit line and applies the readout pass voltage Vpassr2 to the non-selected word line between the selected word line and the source line according to the position of the selected word line. In addition, the same also applies to the verify readout during the write operation. When the controller 140 performs the verify readout on the selected word line selected for writing, the readout pass voltage Vpassr1 is applied to the non-selected word line between the selected word line and the bit line, and the readout pass voltage Vpassr2 is applied to the non-selected word line between the selected word line and the source line.

Next, a modification of the disclosure will be described. The overall resistance of the NAND string increases as the number of W/E cycles increases. In addition, after a large number of W/E cycles, a readout error of misreading the data "1" as the data "0" may occur in the memory cell near the bit line. In order to suppress such readout error, the first embodiment to the third embodiment provide the novel biasing method of the readout voltage Vread and the readout pass voltage Vpassr. The first embodiment provides the setting of the readout voltage Vread applied to the word line for reading. The second embodiment and the third embodiment provide the setting of the readout pass voltage Vpassr applied to the non-selected word line for reading. These embodiments all have the effect of reducing the readout error in the memory cell near the bit line side after a large number of W/E cycles. Therefore, the modification of the disclosure may also be used in combination with the first to third embodiments. For example, the modification may be a combination of the first and second embodiments, a combination of the first and third embodiments, a combination of the second and third embodiments, or a combination of the first to third embodiments.

In addition, in the described embodiments, for the sake of simplicity, the NAND string does not include a dummy memory cell, but the dummy memory cell may also be disposed adjacent to the bit line side selection transistor and/or the source line side selection transistor. The embodiments of the disclosure have been described in detail above, but the disclosure is not limited to a specific embodiment. Various modifications and changes may be made within the scope of the spirit of the disclosure described in the claims.

What is claimed is:

1. A reading method of a NAND flash memory, comprising:
setting a readout voltage to increase toward a bit line side when the readout voltage is applied to a selected word line,
a verify readout voltage applied on a word line selected during a program operation performed based on a program command is constant regardless of which word line being selected when programming is performed.

2. The reading method according to claim 1, comprising:
dividing a plurality of word lines connected to each memory cell of a NAND string into at least three groups, presetting a relationship that each readout voltage corresponding to each group increases toward the bit line side, and determining the readout voltage based on the relationship.

3. The reading method according to claim 1, comprising:
setting a readout pass voltage to increase toward the bit line side with the selected word line when the readout voltage is applied to the selected word line and the readout pass voltage is applied to a non-selected word line.

4. The reading method according to claim 3, comprising:
dividing a plurality of word lines connected to each memory cell of a NAND string into at least two groups, presetting each group with a relationship that the readout pass voltage increases toward the bit line side with the selected word line, and determining the readout pass voltage based on the relationship.

5. The reading method according to claim 1, comprising:
setting a readout pass voltage applied to a non-selected word line between the selected word line and a source line to be greater than the readout pass voltage applied to the non-selected word line between the selected word line and a bit line when applying the readout voltage to the selected word line and applying the readout pass voltage to the non-selected word line.

6. The reading method according to claim 1, comprising:
dividing a plurality of word lines connected to each memory cell of a NAND string into at least three groups, presetting a first relationship that each readout voltage corresponding to each group increases toward the bit line side, dividing the plurality of word lines connected to each memory cell of the NAND string into at least two groups, presetting each group with a second relationship that a readout pass voltage increases toward the bit line side with the selected word line, and determining the readout voltage based on the first relationship and determining the readout pass voltage based on the second relationship when applying the readout voltage to the selected word line and applying the readout pass voltage to a non-selected word line.

7. The reading method according to claim 1, comprising:
dividing a plurality of word lines connected to each memory cell of a NAND string into at least three groups, presetting a relationship that each readout voltage corresponding to each group increases toward the bit line side, and determining a readout pass voltage based on the relationship when applying the readout voltage to the selected word line and applying the readout pass voltage to a non-selected word line, wherein the readout pass voltage applied to the non-selected word line between the selected word line and a source line is set to be greater than the readout pass voltage applied to the non-selected word line between the selected word line and a bit line.

8. A semiconductor memory device, comprising:
a NAND memory cell array, formed with a NAND string;
a readout component, applying a readout voltage to a selected word line to read a page of the NAND memory cell array, and applying a verify readout voltage on a word line selected during a program operation performed based on a program command, the verify readout voltage is constant regardless of which word line being selected when programming is performed; and
a setting component, setting the readout voltage to increase toward a bit line side.

9. The semiconductor memory device according to claim 8, wherein the setting component divides a plurality of word lines connected to each memory cell of the NAND string into at least three groups, and sets a relationship that each readout voltage corresponding to each group increases toward the bit line side, and
the readout component applies the readout voltage to the selected word line based on the relationship set by the setting component.

10. The semiconductor memory device according to claim 8, wherein the setting component divides a plurality of word lines connected to each memory cell of the NAND string into at least two groups, and sets each group with a relationship that a readout pass voltage increases toward the bit line side with the selected word line, and
the readout component applies the readout pass voltage to a non-selected word line based on the relationship set by the setting component.

11. The semiconductor memory device according to claim 8, wherein the readout component applies a readout pass voltage to a non-selected word line with the readout pass voltage applied to the non-selected word line between the selected word line and a source line being greater than the readout pass voltage applied to the non-selected word line between the selected word line and a bit line.

12. The semiconductor memory device according to claim 8, wherein the setting component divides a plurality of word lines connected to each memory cell of the NAND string into at least three groups, sets a first relationship that each readout voltage corresponding to each group increases toward the bit line side, divides the plurality of word lines connected to each memory cell of the NAND string into at least two groups, and sets each group with a second relationship that a readout pass voltage increases toward the bit line side with the selected word line, and
the readout component applies the readout voltage to the selected word line based on the first relationship set by the setting component, and applies the readout pass voltage to a non-selected word line based on the second relationship.

13. The semiconductor memory device according to claim 8, wherein the setting component divides a plurality of word lines connected to each memory cell of the NAND string into at least three groups, and sets a relationship that each readout voltage corresponding to each group increases toward the bit line side, and the readout component applies the readout voltage to the selected word line based on the relationship set by the setting component, and applies a readout pass voltage to a non-selected word line with the readout pass voltage applied to the non-selected word line between the selected word line and a source line being greater than the readout pass voltage applied to the non-selected word line between the selected word line and a bit line.

* * * * *